(12) United States Patent
Rostalski et al.

(10) Patent No.: US 7,187,503 B2
(45) Date of Patent: Mar. 6, 2007

(54) REFRACTIVE PROJECTION OBJECTIVE FOR IMMERSION LITHOGRAPHY

(75) Inventors: Hans-Juergen Rostalski, Oberkochen (DE); Aurelian Dodoc, Oberkochen (DE); Alexander Epple, Aalen (DE); Helmut Beierl, Heidenheim (DE)

(73) Assignee: Carl Zeiss SMT AG, Oberkochen (DE)

( * ) Notice: Subject to any disclaimer, the term of this patent is extended or adjusted under 35 U.S.C. 154(b) by 14 days.

(21) Appl. No.: 11/011,610

(22) Filed: Dec. 15, 2004

(65) Prior Publication Data

US 2005/0190455 A1     Sep. 1, 2005

Related U.S. Application Data

(63) Continuation-in-part of application No. 10/734,623, filed on Dec. 15, 2003, now Pat. No. 6,995,930, which is a continuation-in-part of application No. 09/751,352, filed on Dec. 27, 2000, now Pat. No. 6,665,126.

(60) Provisional application No. 60/612,823, filed on Sep. 24, 2004, provisional application No. 60/592,208, filed on Jul. 29, 2004, provisional application No. 60/591,775, filed on Jul. 27, 2004, provisional application No. 60/568,006, filed on May 4, 2004, provisional application No. 60/544,967, filed on Feb. 13, 2004, provisional application No. 60/530,978, filed on Dec. 22, 2003, provisional application No. 60/530,623, filed on Dec. 19, 2003, provisional application No. 60/511,673, filed on Oct. 17, 2003, provisional application No. 60/222,798, filed on Aug. 2, 2000, provisional application No. 60/173,523, filed on Dec. 29, 1999.

(30) Foreign Application Priority Data

Oct. 22, 2004   (DE)   ................. 10 2004 051 730

(51) Int. Cl.
G02B 9/00    (2006.01)
G02B 9/60    (2006.01)
G03B 27/54   (2006.01)

(52) U.S. Cl. .................. 359/649; 359/770; 355/67
(58) Field of Classification Search .............. 359/349, 359/770, 649; 355/67
See application file for complete search history.

(56) References Cited

U.S. PATENT DOCUMENTS

| | | |
|---|---|---|
| 4,480,910 A | 11/1984 | Takanashi et al. |
| 5,610,683 A | 3/1997 | Takahashi |
| 2003/0174408 A1 | 9/2003 | Rostalski et al. |
| 2004/0004757 A1* | 1/2004 | Schuster ............ 359/365 |
| 2004/0220070 A1 | 11/2004 | Weippert et al. |

FOREIGN PATENT DOCUMENTS

| | | |
|---|---|---|
| DE | 102 24 361 A1 | 11/2003 |
| EP | 0 605 103 A1 | 7/1994 |
| JP | 10-303114 A | 11/1998 |
| WO | WO 03/077036 A1 | 9/2003 |
| WO | WO 03/077037 A1 | 9/2003 |
| WO | WO 03/093904 A1 | 11/2003 |

OTHER PUBLICATIONS

M. Switkes and M. Rothschild, "Immersion Lithography at 157nm", J. Vac. Sci. Technol. B, Nov./Dec. 2001, pp. 2353-2356, vol. 19, No. 6.
U.S. Appl. No. 60/632,550, filed Oct. 20, 2005, Rostalski et al.

* cited by examiner

*Primary Examiner*—Ricky Mack
*Assistant Examiner*—William Choi
(74) *Attorney, Agent, or Firm*—Sughrue Mion, PLLC

(57) ABSTRACT

A purely refractive projection objective suitable for immersion microlithography is designed as a single-waist system with five lens groups, in the case of which a first lens group with negative refractive power, a second lens group with positive refractive power, a third lens group with negative refractive power, a fourth lens group with positive refractive power and a fifth lens group with positive refractive power are provided. A constriction site of narrowest constriction of the beam bundle lies in the region of the waist. A waist distance AT exists between the object plane and the constriction site X. The condition AT/L≦0.4 holds for a distance ratio AT/L between the waist distance AT and an object-image distance L of the projection objective. Embodiments of inventive projection objectives reach very high numerical apertures NA>1.1 in conjunction with a large image field and are distinguished by a compact overall size and good correction of the lateral chromatic aberration.

48 Claims, 3 Drawing Sheets

REFRACTIVE PROJECTION OBJECTIVE FOR IMMERSION LITHOGRAPHY

The present application is a Continuation-in-Part of application Ser. No. 10/734,623, filed Dec. 15, 2003 now U.S. Pat. No. 6,995,930; which is a Continuation-in-Part Application of prior application Ser. No. 09/751,352, filed Dec. 27, 2000 now U.S. Pat. No. 6,665126, which, in turn, claims the benefit of Provisional Application No. 60/173,523, filed Dec. 29, 1999, and of Provisional Application No. 60/222, 798, filed Aug. 2, 2000; Application No. 10/734,623 additionally claims the benefit of Provisional Application No. 60/511,673, filed Oct. 17, 2003; the present application additionally claims the benefit of U.S. Provisional 60/530, 623, filed Dec. 19, 2003, U.S. Provisional 60/530,978, filed Dec. 22, 2003, U.S. Provisional, 60/544,967, filed Feb. 13, 2004, U.S. Provisional 60/568,006, filed May 4, 2004, U.S. Provisional 60/591,775, filed Jul. 27, 2004, U.S. Provisional 60/592,208, filed Jul. 29, 2004, U.S. Provisional 60/612,823, filed Sep. 24, 2004, and German Patent Application 102004051730.4, filed Oct. 22, 2004.

BACKGROUND OF THE INVENTION

1. Field of the Invention

The invention relates to a refractive projection objective for projecting a pattern arranged in an object plane of the projection objective into an image plane of the projection objective, in particular with the aid of an immersion medium that is arranged between a last optical element of the projection objective and the image plane.

2. Description of the Related Art

Photolithographic projection objectives have been in use for several decades for producing semiconductor components and other finely structured structural elements. They serve the purpose of projecting patterns of photomasks or reticles, which are also denoted below as masks or reticles, onto an object coated with a photosensitive layer with very high resolution on a reducing scale.

Three developments running in parallel chiefly contribute to the production of ever finer structures of the order of magnitude of 100 nm or below. Firstly, an attempt is being made to increase the image-side numerical aperture (NA) of the projection objectives beyond the currently customary values into the region of NA=0.8 or above. Secondly, ever shorter wavelengths of ultraviolet light are being used, preferably wavelengths of less than 260 nm, for example 248 nm, 193 nm, 157 nm or below. Finally, still other measures are being used to increase resolution, for example phase-shifting masks and/or oblique illumination.

In addition, there are already approaches to improving the achievable resolution by introducing an immersion medium of high refractive index into the space between the last optical element of the projection objective and the substrate. This technique is denoted here as immersion lithography. The projection objectives suitable for this purpose are denoted as immersion objectives or immersion systems. Introducing the immersion medium yields an effective wavelength of $\lambda_{eff}=\lambda_0/n$, $\lambda_0$ being the vacuum operating wavelength and n the refractive index of the immersion medium. This yields a resolution of $R=k_1 (\lambda_{eff}/NA_0)$ and a depth of focus (DOF) of $DOF=\pm k_2 (\lambda_{eff}/NA_0^2)$, $NA_0=\sin \Theta_0$ being the "dry" numerical aperture, and $\Theta_0$ being half the aperture angle of the objective. The empirical constants $k_1$ and $k_2$ depend on the process.

The theoretical advantages of immersion lithography reside in the reduction of the effective operating wavelength and the resolution improved thereby. This can be achieved in conjunction with an unchanged vacuum wavelength, and so established techniques for producing light, for selecting optical materials, for coating technology etc. can be adopted largely without change for the appropriate wavelength. However, measures are required for providing projection objectives with very high numerical apertures in the region of NA=1 or above. Furthermore, suitable immersion media must be available.

Ultra-pure water with $n_{1\sim1.43}$ emerges as a suitable immersion medium for 193 nm.

The article entitled "Immersion Lithography at 157 nm" by M. Switkes and M. Rothschild, J. Vac. Sci. Technol. Vol. 19 (6), November/December 2001, pages 1 ff. presents immersion fluids based on perfluoropolyethers (PFPE) which are sufficiently transparent for a working wavelength of 157 nm and are compatible with some photoresist materials currently being used in microlithography. One tested immersion fluid has a refractive index of $n_1$=1.37 at 157 nm. The publication also describes a lens-free optical system, operating with calcium fluoride elements and silicon mirrors, for immersion interference lithography, which is intended to permit the projection of 60 nm structures and below in conjunction with a numerical aperture of NA=0.86. The optical system may not be suitable for use in the series production of semiconductors or the like.

Patent Specifications U.S. Pat. No. 4,480,910 and U.S. Pat. No. 5,610,683 (corresponding to EP 0 605 103) describe projection exposure machines, provided for immersion lithography, having devices for introducing immersion fluid between the projection objective and the substrate. No design is specified for the optical projection system.

Some projection objectives suitable for immersion lithography have recently become known. Purely refractive projection objectives known from the international patent applications WO 03/077036 and WO 03/077037 A1 (corresponding to U.S. Pat. No. 2003/0174408) of the applicant are designed as so-called single-waist systems or two-belly systems with an object-side belly, an image-side belly and a waist situated there between, that is to say a constriction of the beam bundle diameter. Image-side numeral apertures of up to NA=1.1 have been achieved in this case.

Attempts to achieve yet higher apertures are rendered difficult because the maximum lens diameters increase dramatically as apertures become larger, and this complicates the fabrication of the projection objectives, making it more expensive. In addition, the chromatic aberrations and here, in particular, the lateral chromatic aberrations assume disturbing values. The lateral chromatic aberrations (CHV) are also denoted as chromatic magnification aberrations, and have the effect that partial images are imaged with a different size for different wavelengths. The consequence of this is that the lateral chromatic aberration does not occur on the optical axis, but is noticed ever more strongly toward the edge of the image field (field dependence).

Chromatic aberrations are usually reduced by using at least two optical materials of different dispersion inside a projection objective. However, in the wavelength region of the deep ultraviolet (DUV) at operating wavelengths of less than 200 nm only a few transparent optical materials with sufficiently low absorption are available. For applications at 193 nm, use is made chiefly of synthetic silica glass (fused silica) ($SiO_2$) as principal material and, as second type of material, fluoride crystal materials such as calcium fluoride ($CaF_2$) or barium fluoride ($BaF_2$). As a rule, at 157 nm calcium fluoride is used as principal material and barium fluoride as second material. However, said fluoride crystal materials are available only to a limited extent, expensive and difficult to work. Consequently, it is desired to have optical designs that manage with only one type of material, in particular with synthetic silica glass. In any case, the chromatic aberrations must be minimized such that contrast losses caused by the chromatic aberrations remain tolerable when use is made of radiation sources that are suitably narrowband. Particularly important here is the correction of the lateral chromatic aberration, since the latter produces a contrast loss that is a function of the field.

SUMMARY OF THE INVENTION

One of the objects of the invention is to provide a refractive projection objective that is suitable for immersion lithography. It is another object to provide a refractive projection objective that has a compact overall size. It is another object to provide a refractive projection objective that can be produced with acceptable use of materials. It is another object to provide a refractive projection objective that has a good correction state for chromatic aberrations, in particular for lateral chromatic aberrations.

In view of these and other objects, this invention, according to one formulation, provides a refractive projection objective for projecting a pattern arranged in an object plane of the projection objective into the image plane of the projection objective comprising:

a first lens group with negative refractive power following the object plane;
a second lens group with positive refractive power, thereupon;
a third lens group with negative refractive power following thereupon;
a fourth lens group with positive refractive power following thereupon;
a fifth lens group with positive refractive power following thereupon; and
a system aperture that is arranged in a transition region from the fourth lens group to the fifth lens group,
so as to form a single-waist system with an object-side belly, an image-side belly and a waist, arranged between the object-side belly and the image-side belly, with a constriction site of narrowest constriction of a beam,
a waist distance AT existing between the object plane and the constriction site, and the condition AT/L≦0.4 holding for a distance ratio AT/L between the waist distance AT and an object-image distance L of the projection objective.

Advantageous developments are specified in the dependent claims. The wording of all the claims is incorporated in the description by reference. The projection objective may be adapted to immersion lithography where the projection is performed with the aid of an immersion medium that is arranged between a last optical element of the projection objective and the image plane.

The said refractive power distribution over the individual lens groups produces a projection objective having two bellies and a waist there between, the result being a good correction of the field curvature (Petzval correction). In this case, the object side belly is substantially shorter in relation to the overall length (object–image distance) L than in the case of known two-belly systems. The distance ratio AT/L can, in particular, be smaller than 0.38 or smaller than 0.36 or smaller than 0.34. It is therefore favorable when the waist is arranged very far in the front region, near the object, of the projection objective.

The lateral chromatic aberration is a function of the marginal beam height and the principal beam height as well as of the refractive power at each lens. Here, the marginal beam height is the perpendicular distance of a marginal beam from the optical axis, a marginal beam leading from the middle of the object field to the aperture edge of the system aperture that determines the numerical aperture used. The principal beam height is the perpendicular distance of the principal beam from the optical axis, while within the meaning of this application the principal beam is a beam that runs from an outer marginal point of the object field parallel or at an acute angle to the optical axis, and which cuts the optical axis in the region of the system aperture.

In a two-belly system (single-waist system) the principal beam height is greatest in the object-side belly. The marginal beam heights have a considerable value here, as well. The height of the principal beams should be kept small in the object-side belly by suitable selection of the refractive powers. A good compromise for the requirements that are to be simultaneously fulfilled can be achieved when the waist is arranged far away in the front region near the object plane of the system. As an alternative, or in addition, it is advantageous for the correction of the lateral chromatic aberration, in particular, when a favorable ratio of the diameters of the bellies of the system is set. In one development, the object-side belly has a first diameter D1, and the image-side belly has a second diameter D3, and it holds for a belly diameter ratio D3/D1 that: D3/D1>1.5. It is particularly advantageous when the belly diameter ratio is more than 1.6 or more than 1.7. A small belly diameter in the object-side belly corresponds to small marginal beam heights and, in addition, to small principal beam heights in the object-side belly from which the principal contributions to the lateral chromatic aberration come.

In accordance with one development, the waist has a waist diameter D2 at the constriction site, and it holds that D3/D2≧3 for a diameter ratio D3/D2 between the diameter of the image-side belly and the waist diameter. The waist is therefore very slim compared to the image-side second belly, and has moderate marginal beam heights. An effective correction of the field curvature, inter alia, is thereby achieved.

The principal contributions to the lateral chromatic aberration originate from the object-side belly and are kept small by the small diameter of the latter. It can also be corrected by a skilful refractive force distribution in the waist. It has emerged that the output-side lens or lens group of the third lens group, in particular, has a very strongly correcting action. It should have a substantially stronger negative refractive power than the at least one input-side negative lens of the third lens group. In particular, it can be advantageous when in the third lens group a front negative refractive power of magnitude VBK is arranged upstream of the constriction site and a rear negative refractive power of magnitude HBK is arranged downstream of the constriction site, and HBK/VBK≧3 holds for a refractive power ratio of the magnitudes.

It is particularly advantageous when the third lens group comprises a rear negative lens and at least one front negative lens arranged upstream of the rear negative lens, the magnitude of the negative refractive power of the rear negative lens being at least 20% greater than the magnitude of the negative refractive power of the at least one front negative lens of the third lens group. Consequently, the rear (last) negative lens of the third lens group should have by far the highest negative refractive power of the lenses in this group. In some embodiments, the magnitude of the negative refractive power of the rear negative lens of the third lens group is at least 20% larger than the magnitude of the total refractive power of the projection objective. The negative refractive power in the region of the waist can exert a particularly strong corrective action on the lateral chromatic aberration when these conditions are observed.

The correction of monochromatic aberrations can be optimized by the use of aspheric surfaces under the boundary condition of a minimum use of material.

In one embodiment, the first lens group includes at least one aspheric surface, at least two aspheric surfaces preferably being provided in the first lens group. An arrangement of aspheres in a region that is near the field and in which the principal beam height is substantially greater than the marginal beam height can be used for an effective distortion correction. Moreover, a telecentric beam path on the object side can be achieved at least approximately. The first lens group preferably includes two lenses with in each case one aspheric surface. The distribution of aspheres over a number of lenses simplifies the production, since it is possible to avoid large surface deformations.

It is preferable to arrange in the second lens group at least one aspheric surface that can be used, in particular, to correct the tangential shell and the coma effectively. It is advantageous to arrange an aspheric surface on the surface with the greatest principal beam height of the second lens group. In some embodiments, the corrective action is supported by the arrangement of at least one aspheric surface upstream of, and at least one aspheric surface downstream of this aspheric surface.

It has emerged that the correction of coma can be improved when at least one concave surface is respectively fashioned as aspheric surface in the third lens group and/or in the fourth lens group.

At least one aspheric surface is preferably also provided in the fourth lens group and in the fifth lens group. The aspheric surfaces in the fourth lens group and in the fifth lens group contribute principally to correcting the aspherical aberration and exhibit substantial contributions to the coma correction.

It is therefore particularly advantageous when at least one aspheric surface is arranged in each lens group.

In one development, at least one meniscus lens concave to the object plane is arranged in the fourth lens group. This is preferably designed as a negative meniscus lens. It can be arranged directly upstream of the system aperture in the region of very large marginal beam heights. Such a meniscus lens, in particular with negative refractive power, can contribute substantially to correcting the spherical aberration, specifically with the effect of a strong over correction. A large part of the spherical under correction of the lenses downstream of the system aperture, that is to say the lenses of the fifth lens group, can thereby be balanced out.

It is advantageous for the corrective action to have large incidence angles of the incident radiation on the concave side of the meniscus lens. The largest incidence angles in the entire system preferably occur at this concave surface. Large incidence angles are, on the one hand, supported by the concave shape of the surface onto which an at least weakly divergent beam falls in the case of the preferred embodiments. At least one lens with strong positive refractive power, in particular a biconvex lens, is preferably provided directly upstream of the meniscus lens. The incidence angles at the following concave surface can still be enlarged by this lens. Consequently, in preferred embodiments at least one lens doublet with at least one, preferably biconvex, positive lens and one directly downstream negative meniscus lens concave relative to the object plane is arranged in the fourth lens group.

The system aperture can be a planar system aperture in the case of which the edge remains independent of the aperture diameter set in a plane perpendicular to the optical axis. In systems having aperture errors, it can be advantageous when the system aperture has an aperture edge that determines the aperture diameter and whose axial position with reference to the optical axis of the projection objective can be varied as a function of the aperture diameter. This permits optimum adaptation of the effective aperture position to the beam path as a function of aperture diameter. The system aperture can be designed, for example, as a spherical aperture in which the aperture edge can be moved along a spherical surface during adjustment of the aperture diameter. It is also possible to design the system aperture as a conical aperture in which the aperture edge can be moved on the lateral surface of a cone during adjustment of the aperture diameter. This can be achieved, for example, by means of an axially displaceable planar aperture.

Projection systems according to the invention can be provided for a wide range of suitable working distances. In this case, the object-side working distance or the working distance in the object space is the (smallest) axial distance between the object plane and the entrance surface of the objective, while the image-side working distance or the working distance in the image space is the (smallest) axial distance between the exit surface of the objective and the image plane. The working distance in the image space, which is filled with gas in the event of use as a dry system, is filled with an immersion medium during operation in the case of use as an immersion system.

In the case of immersion systems, special criteria are to be considered when fixing the working distance in the image space. A large working distance on the one hand effects both heavier radiation losses because of the usually lower transmission of immersion liquids (by comparison with gas), and a higher contribution to aberration from the surfaces bearing against the image plane, specifically for spherical aberration. If use as an immersion system is envisaged, the image-side working distance should be large enough to permit a laminar flow of an immersion fluid. If appropriate, there should also be room for measuring instruments and sensors. In preferred embodiments for immersion lithography, the image-side working distance is between approximately 1 mm and approximately 15 mm, in particular between approximately 1.5 mm and approximately 5 mm.

One means of keeping the marginal beam heights in the first belly small is to select the smallest possible numerical aperture for the object side. The result of this is that the marginal beam heights in the object-side belly do not assume excessive values. A small object-side numerical aperture can be controlled by selecting a suitable magnification ratio $\beta$ in conjunction with a large image-side numerical aperture. Preferred embodiments are designed as reduction objectives. The magnitude $|\beta|$ of the magnification ratio is preferably in the range from 1/10 to 1/3, in particular between 1/8.5 and 1/3.5, such that, in particular, reductions of 5:1 and 4:1 are possible. As an alternative to these "classical" reduction ratios it has been proven useful to design projection objectives with a reduction ratio which is an even-numbered multiple of 5:1 or 4:1, for example 10:1 or 8:1.

In some embodiments, all the lenses of the projection objective consist of the same material. The material used can be, for example, synthetic silica glass for operating wavelengths of 193 nm, and calcium fluoride for operating wavelengths 157 nm. The use of only one type of material makes the production easier and permits simple adaptation of the objective design to other wavelengths. It is also possible to combine a number of types of material in order, for example, to assist correction of chromatic aberrations. Also possible is the use of other UV transparent materials such as $BaF_2$, NaF, LiF, SrF, $MgF_2$ or the like.

The invention enables the design of projection objectives whose image-side numerical aperture is NA≧1.0 in the use of suitable immersion media, NA>1.1 in particular NA=1.2, NA=1.3 or above also being possible for some embodiments. The projection objectives can be adapted to an immersion fluid that has a refractive index of $n_1$>1.3 at the operating wavelength. As a result, the effective operating wavelength can be reduced by approximately 30% or more by comparison with systems without immersion.

The structural features of preferred embodiments permit the projection objective to be used as an immersion objective. According to the invention, projection objectives are not, however, restricted to this use. The optical structure also permits their use for contactless near field projection lithography. It is possible here for sufficient light energy to be coupled into the substrate to be exposed via a gas-filled gap when a sufficiently small image-side working distance is maintained on average over time. This distance should be below four times the operating wavelength used, in particular below the operating wavelength. It is particularly advantageous when the working distance is less than half the operating wavelength, for example less than a third, a quarter or a fifth of the operating wavelength. With these short working distances, it is possible to project in the optical near field, in which case the evanescent fields that exist in the immediate vicinity of the last optical surface of the projection system are used for the projection.

If it is desired to use a projection objective instead of immersion lithography for contactless near field lithography, this can easily be done by slight modifications. If the immersion medium to which the optical design is adapted has essentially the same refractive index as the last optical element of the objective, the solid body is fashioned to be thicker in order to achieve a small image-side working distance. Working distances of between 20 and 50 nm, for example, can be achieved in this way. A subsequent optical correction that can be carried out, for example, with the aid of suitable manipulators at one or more lens elements, for example in order to adjust their air distances, can be advantageous, if appropriate.

The invention therefore also comprises a contactless projection exposure method in which evanescent fields of the exposure light, which are located in the immediate vicinity of the exit surface, are rendered useful for the lithographic process. Given sufficiently small (finite) working distances, it is possible here, despite geometric conditions of total reflection at the last optical surface of the projection objective, for a light fraction useful for lithography to be coupled out of the exit surface of the objective and to be coupled into an incoupling surface directly adjacent at a distance.

Embodiments for contactless near field projection lithography preferably have typical working distances in the range of the operating wavelength or below, for example between approximately 3 nm and approximately 200 nm, in particular between approximately 5 nm and approximately 100 nm. The working distance should be adapted to the other properties of the projection system (properties of the projection objective near the exit surface, properties of the substrate near the incoupling surface) so as to achieve an incoupling efficiency of at least 10% on average over time.

Thus, in the framework of the invention a method is possible for producing semiconductor components and the like in the case of which a finite working distance is set between an exit surface, assigned to the projection objective, for exposure light and an incoupling surface, assigned to the substrate, for exposure light, the working distance being set within an exposure time interval at least temporarily to a value that is smaller than a maximum extent of an optical near field of the light emerging from the exit surface.

Otherwise, projection objectives according to the invention can also be used as dry systems for conventional projection lithography. For this purpose, the image-side working distance can be distinctly larger than for use as an immersion system or as a near-field projection system. Since, in some circumstances, it is not possible thereby to exhaust the full potential of very high image-side numerical apertures, the system aperture can be set to a smaller aperture diameter in order, for example, to set a numerical aperture used to the order of magnitude of NA=0.9 or NA=0.8 or below.

The previous and other properties can be seen not only in the claims but also in the description and the drawings, wherein individual characteristics may be used either alone or in sub-combinations as an embodiment of the invention and in other areas and may individually represent advantageous and patentable embodiments.

DETAILED DESCRIPTION OF THE PREFERRED EMBODIMENTS

In the following description of the preferred embodiments, the term "optical axis" denotes a straight line through the centers of curvature of the optical components. Directions and distances are described as on the image side or towards the image, when they are directed in the direction of the image plane or the substrate which is located there and is to be exposed, and as on the object side or towards the object when they are directed towards the object with reference to the optical axis. In the examples, the object is a mask (reticle) with the pattern of an integrated circuit, but another pattern, for example a grating, can also be involved. In the examples, the image is formed on a wafer serving as substrate and coated with a photoresist layer, but other substrates are also possible, for example elements for liquid crystal displays or substrates for optical gratings. The specified focal lengths are focal lengths with reference to air.

Figure 1:
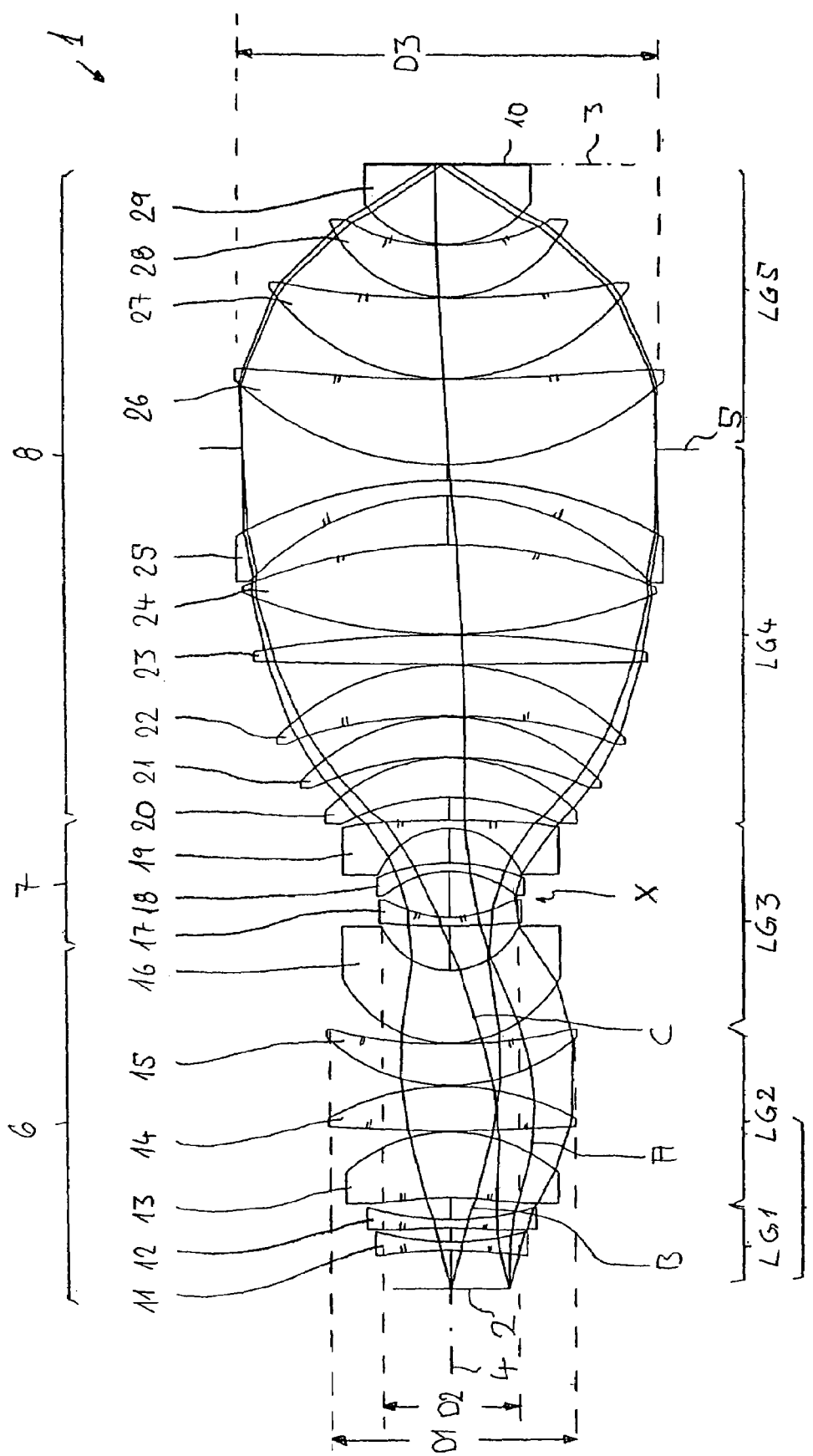
FIG. 1 is a lens section through a first embodiment of a refractive projection objective which is designed for an operating wavelength of 193 nm.

A typical design of an embodiment of an inventive, purely refractive reduction objective 1 is shown with the aid of FIG. 1. Given virtually homogenous immersion, it serves the purpose of projecting a pattern, arranged in an object plane 2, of a reticle or the like into an image plane 3 to a reduced scale, for example to the scale of 5:1 (magnification ratio β=0.2). This is a rotationally symmetrical single-waist system or two-belly system with five consecutive lens groups that are arranged along the optical axis 4, which is perpendicular to the object plane and image plane. The first lens group LG1 directly following the object plane 2 has a negative refractive power. A second lens group LG2 following directly thereon has a positive refractive power. A third lens group LG3 following directly thereon has a negative refractive power. A fourth lens group following directly thereon has a positive refractive power. A fifth lens group LG5 following directly thereon has a positive refractive power. The image plane directly follows the fifth lens group such that the projection objective has no further lens or lens group apart from the first to fifth group. This distribution of refractive power provides a two-belly system that has an object-side first belly 6, an image-side second belly 8 and a waist 7 lying therebetween in which lies a constriction site X with a minimum beam bundle diameter. In a transition region from the fourth lens group to the fifth lens group the system aperture 5 lies in the region of a relatively large beam diameter.

The projection possible with the aid of the projection objective can be characterized by the course of its principal beams and marginal beams. Denoted as principal beam A is a beam that runs from an outer marginal point of the object field parallel or at an acute angle to the optical axis and cuts the optical axis 4 in the region of the system aperture 5. A marginal beam B leaves from the middle of the object field, that is to say from an axial field point, to the aperture edge of an aperture stop that is normally seated at the location of the system aperture 5 or in its immediate vicinity. A beam C that leads from an outer field point to the opposite edge of the aperture stop is denoted here as coma beam. The perpendicular distance of these beams from the optical axis yields the corresponding beam heights $h_A$, $h_B$ and $h_C$.

A first lens region LB1 begins at the object plane 2 and ends in the plane in which the marginal beam B and the coma beam C intersect such that the condition $|h_B/h_C|<1$ is fulfilled in the first lens region LB1. The principal beam light is large in this lens region LB1 by comparison with the marginal beam height. Lens surfaces arranged here are denoted as near field. A second lens region LB2 extends from the object plane 2 as far as into the region in which the principal height and the marginal beam height are approximately equal in order of magnitude, in which case $|h_B/h_A|<1.2$ holds, in particular. For typical variants of inventive projection systems, the length of the second lens region LB2 is greater than a quarter and smaller than half the distance L between the object plane 2 and image plane 3. This object-image distance is also denoted as the overall length of the projection objective.

For typical embodiments of inventive projection objectives, the first lens group LG1 has at least two negative lenses, the second lens group LG2 at least three positive lenses, the third lens group LG3 at least two negative lenses, the fourth lens group LG4 at least two positive lenses and the fifth lens LG5 at least three positive lenses.

The first lens group LG1, which follows the object plane 2, is substantially responsible for widening the light bundle into the first, object-side belly 6. It has a thin biconcave negative lens 11 with an aspheric entrance surface and spherical exit surface, following thereupon, a further biconcave negative lens 12 with an aspheric entrance surface and spherical exit surface. The aspheres, arranged in the near field, on the entrance surfaces of the lenses 11 and 12 nearest the object contribute effectively to the good correction of the distortion and the astigmatism. Above all, they ensure the approximately telecentric beam path on the object side. In the case of the exemplary system, laying the two aspheres onto a single lens is avoided for production reasons, although this is possible with other embodiments.

The second lens group LG2 consists of three lenses 13, 14, 15. It begins with a thick positive meniscus lens 13 with an aspheric, object-side concave surface and spherical exit surface. An immediately following positive lens 14 has an aspheric entrance surface of slightly convex curvature and a spherical exit surface. The following positive meniscus lens 15 has a spherical entrance surface and an aspheric exit surface which is concave on both sides. The aspheric entrance surface of lens 14 is arranged in the region of greatest principal beam height of the second lens group, and is therefore particularly effective for correcting the tangential shell and coma. The aspheres of the lens 13 arranged upstream thereof and of the lens 15 arranged downstream thereof assist this correction.

The third lens group LG3 consists of four negative lenses 16, 17, 18, 19. An entrance-side, thick, bispheric meniscus lens 16 with an image-side concave surface has a weak negative refractive power. The following meniscus lens 17 with a weakly curved, spherical entrance surface, and, on the image side, concave, aspheric exit surface lies in the light path upstream of the constriction site X at which the beam bundle has its minimum diameter in the waist region. The lenses 16, 17 provide a front negative refractive power VBK. Following downstream of the constriction site X is a negative meniscus lens 18 that is spherical on both sides and has an objective-side concave surface. The last negative lens 19 of the third lens group has a strongly curved, spherical entrance surface that is concave on the object side, and a weakly curved, aspheric exit surface. The two rear negative lenses 18, 19 together provide a strong rear negative refractive power HBK. It has emerged that the concave, aspheric exit surface of the lens 17 contributes effectively to correcting coma.

The fourth lens group LG4 consists of six lenses. On its entrance side, it comprises three positive meniscus lenses 20, 21, 22 that are concave relative to the object plane and of which the two first named are bispheric, and the positive meniscus lens 22, which is of greatest diameter, has an aspheric entrance surface that is concave relative to the object plane. The three positive meniscus lenses are followed by a biconvex, bispheric positive lens 23 with weakly curved lens surfaces. Arranged in the region of large beam diameter directly upstream of the system aperture 5 is a lens doublet 24, 25 having an entrance-side biconvex lens 24 of strong positive refractive power and a negative meniscus lens 25, arranged directly upstream of the system aperture and having an object-side, aspheric concave surface. The aspheric surfaces facing one another enclose an air lens that is concave relative to the object plane and has the form of a positive lens. The lens doublet has a strongly overcorrecting effect on spherical aberration.

The fifth lens group LG5, lying downstream of the system aperture 5, is substantially responsible for the production of the high numerical aperture. Exclusively collective lenses are provided for this purpose, specifically three directly consecutive following positive meniscus lenses 26, 27, 28 that in each case have a spherical entrance surface and an aspheric exit surface that is concave relative to the image plane, as well as a terminating, non-hemispherical planar convex lens 29 with a spherical entrance surface and a planar exit surface. The radius of the spherical entry side of lens 29 is larger than the thickness of the lens such that the center of curvature of the entrance surface lies outside the lens 29 beyond the image plane. The positive lenses exert a spherically strongly under-correcting action and, with respect to the coma, an overcorrecting action.

With this design, the correction of the spherical aberration and of the coma is largely borne by the balance between the lens doublet 24, 25 directly upstream of the system aperture 5 and the lenses 26, 27, 28, 29 of the fifth lenses.

The system has an object-side working distance of 32 mm in conjunction with an object back focus of approximately 36.6 mm and an image-side working distance of approximately 2 mm that can be filled up by an immersion liquid 10. The system is designed such that de-ionized water (refractive index n≈1.435) or another suitable transparent liquid with a comparable refractive index can be used as immersion liquid at 1.93 nm.

The specification of the design is summarized in a known way in tabular form in Table 1. Here, column 1 specifies the number of a refracting surface, or one distinguished in another way, column 2 specifies the radius r of the surface (in mm), column 4 specifies the distance d, denoted as thickness, of the surface from the following surface (in mm) and column 5 specifies the material of the optical components. Column 6 shows the refractive index of the material and the useful, free radii or half the free diameter of the lenses (in mm) are specified in column 7. The aspheric surfaces are denoted by "AS" in column 3.

In the case of the embodiment, thirteen of the surfaces, specifically the surfaces 1, 3, 5, 7, 10, 14, 18, 23, 28, 29, 33, 35 and 37 are aspheric. Table 2 specifies the corresponding aspheric data, the aspheric surfaces being calculated using the following rule:

$$p(h)=[((1/r)h^2)/(1+SQRT(1-(1+K)(1/r)^2h^2))]+C1*h^4+C2*h^6+$$

Here, the reciprocal (1/r) of the radius specifies the surface curvature, and h the distance of a surface point from the optical axis (that is to say the beam height). Consequently, p(h) gives the so-called sagitta, that is to say the distance of the surface point from the surface apex in the z direction, that is to say in the direction of the optical axis. The constants K, C1, C2, . . . are reproduced in Table 2.

The optical system 1, which can be reproduced with the aid of these data, is designed for an operating wavelength of approximately 193 nm, for which the synthetic quartz glass used for all the lenses has a refractive index n=1.5603. The image-side numerical aperture NA is 1.3. The object-side and image-side telecentric system is adapted to a refractive index of the immersion medium 10 of $n_1$=1.435. The objective has an overall length L (distance between image plane and object plane) of approximately 1078 mm. A photoconductance LLW (product of numerical aperture and image size) of approximately 29 mm is achieved for an image size of 22.4 mm. The focal length Fg of the overall system is approximately 211 mm.

The maximum diameter D1 of the object-side, first belly is 232 mm, the diameter D2 at the constriction site X of minimum beam diameter in the region of the waist is 126 mm, and the maximum diameter D3 of the second image-side belly is 400 mm.

Specified in Table 3 for the various lens groups and the overall system are the values for the focal length f', the refractive powers F', the values for the parameters F'/Fg (refractive power normalized to the overall refractive power Fg of the objective), and F'·LLW as well as for the axial length.

The values of various parameters are specified in Table 4 for the individual lenses, specified in column 1, of the system. Here, f' is the focal length, F' the refractive power (reciprocal of the focal length), LLW the geometric light guidance value (etendue), CHV the value for the contribution of the lens to the lateral chromatic aberration (CHV contribution), and CHV/CHVm the relative CHV contribution, normalized to the maximum value CHVm, of the individual lenses.

The chromatic magnification error CHV is a function of the marginal beam height and the principal beam height as well as of the refractive power at each lens i. The contribution $CHV_i$ of each lens is proportional to the marginal beam height $h_B$, to the principal beam height $h_A$ and to the refractive power F', and indirectly proportional to the Abbe number $v_i$ in accordance with: $CHV_i \sim h_A\, h_B\, (F'i/V_i)$.

Figure 2:
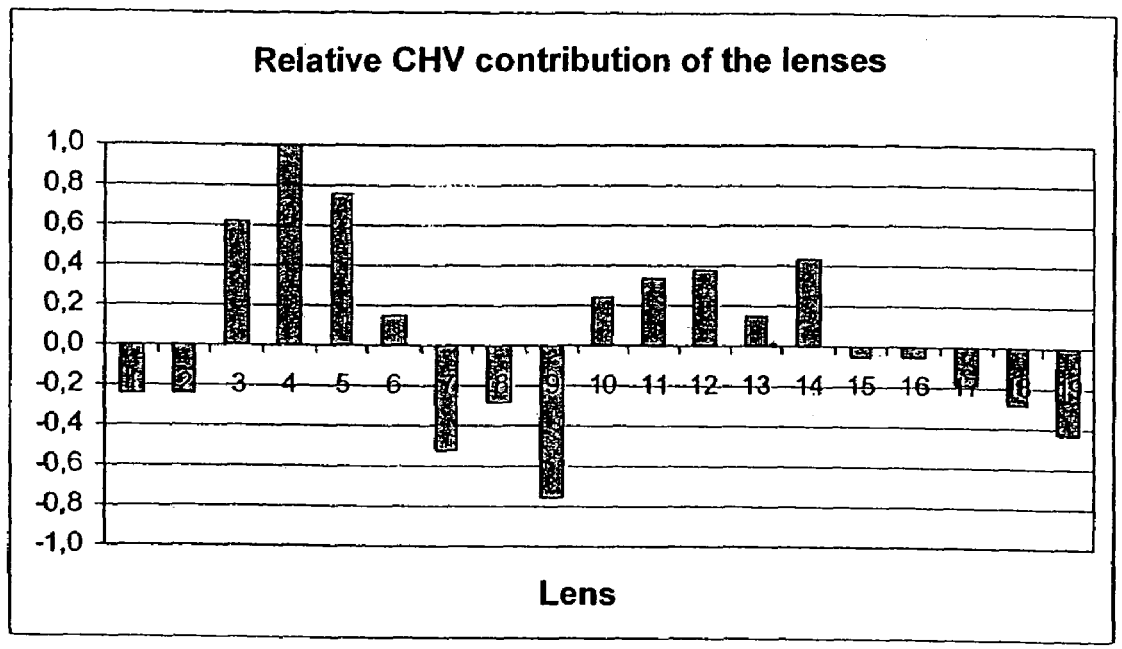
FIG. 2 is a diagram that shows the relative contributions of the individual lenses to the transverse chromatic aberration.
Figure 3:
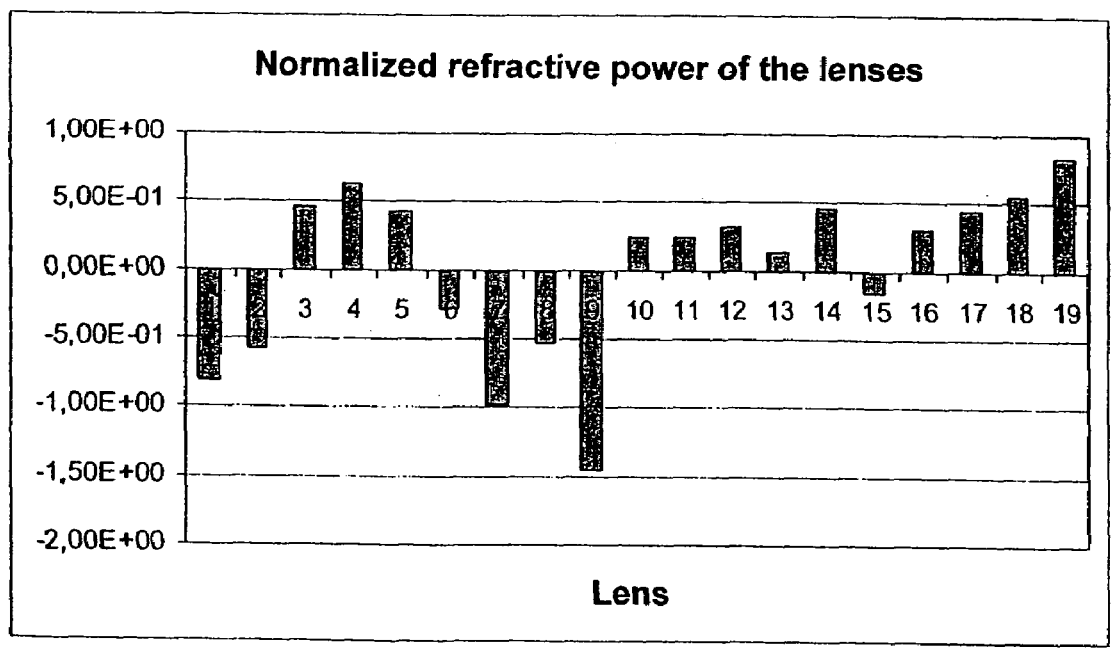
FIG. 3 is a diagram that shows normalized refractive powers of the individual lenses.

In order to improve the explanation of distribution of relevant values, FIG. 2 plots the relative contribution of the individual lenses to the lateral chromatic aberration (CHV contribution, normalized to the maximum value CHVm for lens 4), and FIG. 3 plots the refractive powers (F'/Fg), normalized to the overall refractive power of the lenses as a function of the lens number.

Table 5 shows for the lens surfaces given in column 1 the sinusoidal values sin(i) of the incidence angles i, the corresponding angle in degrees and the ratio of the sin(i) values to the image-side numerical aperture NA. The sin(i) values correspond to the maximum value of the sine of the incidence angle or of the refracting angle at each surface. They are thus always specified in air.

A few particular features of the projection objective are explained below. The objective opens with two aspherized negative lenses 11, 12 that serve the purpose of beam widening and of correcting distortion and telecentrism. Because of the relatively small object-side numerical aperture of $NA_o$=0.26, the marginal beam heights in the input region of the projection objective remain moderate. Within the first belly 6, the maximum marginal beam height is reached in the region of the positive meniscus 15, and there contributes only 24.3% of the maximum marginal beam height which is reached in the region of the system aperture 5. The maximum principal beam height is reached in the region of the spherical exit surface of the fourth lens 14, where the marginal beam height has not yet reached its maximum value. The maximum principal beam height is only 40.8% of the maximum marginal beam height, which corresponds to the maximum aperture radius. Because of the proportionality of the CHV contribution to the marginal beam height and to the principal beam height, the maximum CHV contribution of the lens with maximum principal beam height (lens 14) is reached (compare FIG. 2).

The contributions, originating chiefly from the first belly, to the chromatic magnification error CHV are compensated by the following lens groups. Particularly effective for this purpose is the concentration of strongly negative refractive power directly upstream of entry into the object-side belly, which opens with the fourth lens group of positive refractive power. The strongly correcting action of the negative refractive power in this region at the output of the third lens group can be explained in part by virtue of the fact that here, on the one hand, the marginal beam heights already again assume substantial values and, on the other hand, the principal beam height also still has values so large that a strong correcting action is exerted on the principal beam.

The three positive meniscus lenses 20, 21, 22 that are concave relative to the object plane introduce the recombination of the beam bundle after the maximum expansion downstream of the negative lens 19, a relaxed beam guidance with very low incidence angles (Table 5) being achieved. Spherical undercorrection is introduced together with the downstream weakly positive biconvex lens 23. The negative meniscus lens 25 directly upstream of the system aperture makes a substantial contribution to correcting the spherical aberration, specifically in the sense of a strong overcorrection. A large part of the spherical undercorrection of the positive lenses 26 to 29 of the fifth lens group downstream of the system aperture 5 is thereby balanced out. Also of great significance are the very large incidence angles at the concave entrance side of the meniscus 25. These are produced, on the one hand, by the strong curvature of the concave side and, on the other hand, by the large positive force of the biconvex lens directly upstream of the meniscus. The greatest incidence angles in the overall system occur at the aspheric entrance surface of the negative meniscus 25. The maximum sine of the incidence angle is at approximately 99% of the image-side numerical aperture NA.

The four consecutive positive lenses 26 to 29 of the fifth lens group LG5 produce the high image-side numerical aperture in conjunction with moderate incidence angles, and act overall in a spherically strongly under-correcting fashion, as well as in an overcorrecting fashion with reference to coma. The respective inverted contributions of the fourth lens group upstream of the system aperture is thereby compensated such that there is an excellent correction state in the image plane 3 after passage of the radiation through the thin immersion layer 10.

Figure 4:
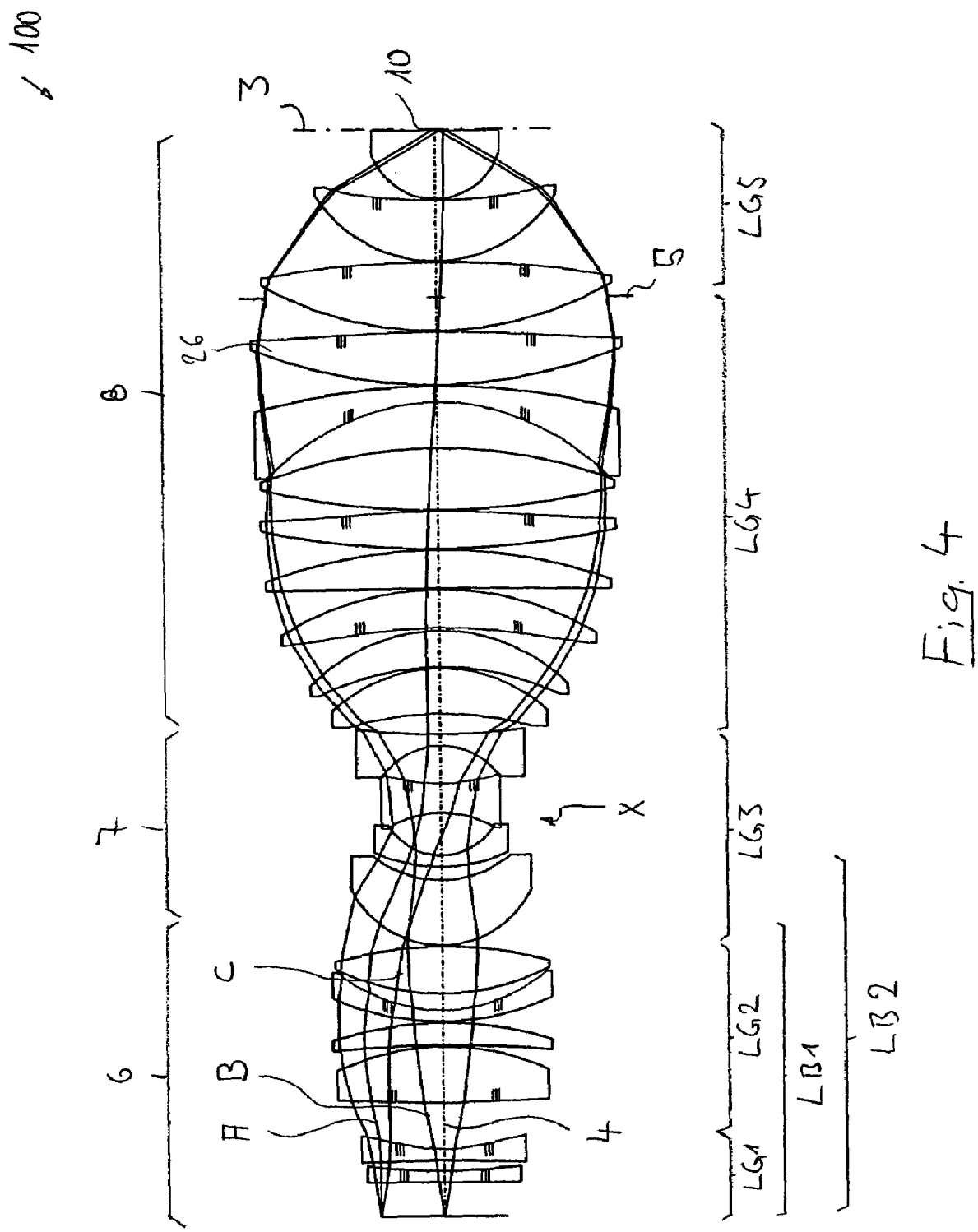
FIG. 4 is a lens section through a second embodiment of a refractive projection objective designed for 193 nm having an 8:1 reduction ratio.

A second embodiment of a refractive projection objective 100 designed essentially following the principles explained above is shown in FIG. 4. Corresponding lenses and lens groups are designated with the same reference numerals as for the system in FIG. 1 for easier reference. The specification of the design is summarized in tables 6 and 7 (aspheric constants). The immersion objective is adapted to water as an immersion liquid, which can fill an image side working distance of about 1 mm. The image side numerical aperture is NA=1.35.

Whereas the basic layout of lens groups and features regarding the diameter ratio of the two bellies is about the same as in the embodiment of FIG. 1, there are some remarkable differences.

The reduction ratio is 8:1 instead of 5:1 for the embodiment of FIG. 1. The stronger reduction ratio allows using masks with coarser patterns to achieve the same scale of the printed patterns and/or a finer printed pattern from masks having similar typical dimensions in the mask. At the same time, the image field is still large enough to allow a fast printing process. The system aperture 5 is positioned between the region of maximum beam diameter in the second belly 8 (near lens 26) and the image plane 3 in a region where the beam already converges towards the image. Only three positive lenses are positioned between the aperture stop and the image plane.

The invention also relates to a projection exposure machine for microlithography that is distinguished in that it includes a refractive projection objective in accordance with the invention. The projection exposure machine preferably also has devices for introducing and holding an immersion medium, for example a liquid of suitable refractive index, between the last optical surface of the projection objective and the substrate to be exposed. Also comprised is a method for producing semiconductor components and other finely structured components in the case of which an image of a pattern arranged in the object plane of a projection objective is projected in the region of the image plane, an immersion medium that is arranged between the projection objective and the substrate to be exposed and is transparent to light of the operating wavelength being trans-irradiated.

The above description of the preferred embodiments has been given by way of example. From the disclosure given, those skilled in the art will not only understand the present invention and its attendant advantages, but will also find apparent various changes and modifications to the structures and methods disclosed. It is sought, therefore, to cover all changes and modifications as fall within the spirit and scope of the invention, as defined by the appended claims, and equivalents thereof.

TABLE 1

| Surface | Radii | Thicknesses | Material | Refractive index 193.2 nm | ½ free diameter |
|---|---|---|---|---|---|
| 0 | 0.000000000 | 36.662040112 |  | 1.00000000 | 56.080 |
| 1 | −323.460902261 AS | 8.038278274 | SIO2HL | 1.56028890 | 65.181 |
| 2 | 267.816434208 | 13.482406462 | N2VP950 | 1.00000300 | 70.676 |
| 3 | −731.733384848 AS | 8.004913961 | SIO2HL | 1.56028890 | 72.721 |
| 4 | 280.978130617 | 20.306990261 | N2VP950 | 1.00000300 | 79.133 |
| 5 | −319.980416314 AS | 62.121799936 | SIO2HL | 1.56028890 | 82.507 |
| 6 | −153.901726749 | 1.000000000 | N2VP950 | 1.00000300 | 98.551 |
| 7 | 783.449175169 AS | 42.497535358 | SIO2HL | 1.56028890 | 112.607 |
| 8 | −243.461838569 | 1.000000000 | N2VP950 | 1.00000300 | 114.585 |
| 9 | 179.227467379 | 39.125143879 | SIO2HL | 1.56028890 | 116.001 |
| 10 | 480.906878341 AS | 1.000000000 | N2VP950 | 1.00000300 | 113.279 |
| 11 | 118.324412188 | 69.486781697 | SIO2HL | 1.56028890 | 101.117 |
| 12 | 73.058237095 | 42.380894116 | N2VP950 | 1.00000300 | 66.160 |
| 13 | 804.799335653 | 8.000000000 | SIO2HL | 1.56028890 | 65.718 |
| 14 | 104.005737015 AS | 44.110760436 | N2VP950 | 1.00000300 | 62.994 |
| 15 | −98.848204915 | 8.000000000 | SIO2HL | 1.56028890 | 63.113 |
| 16 | −182.724753260 | 33.646618163 | N2VP950 | 1.00000300 | 68.253 |
| 17 | −76.124405725 | 8.000000000 | SIO2HL | 1.56028890 | 68.955 |
| 18 | −1194.521750855 AS | 21.838763844 | N2VP950 | 1.00000300 | 100.434 |
| 19 | −226.579410865 | 38.146641402 | SIO2HL | 1.56028890 | 103.971 |
| 20 | −164.064155469 | 1.000000000 | N2VP950 | 1.00000300 | 116.815 |
| 21 | −306.672815568 | 38.446849323 | SIO2HL | 1.56028890 | 132.820 |
| 22 | −195.444904770 | 1.000000000 | N2VP950 | 1.00000300 | 139.642 |
| 23 | −566.123511009 AS | 49.471751921 | SIO2HL | 1.56028890 | 156.750 |
| 24 | −229.513378771 | 1.000000000 | N2VP950 | 1.00000300 | 161.797 |
| 25 | 7198.266735077 | 28.157625168 | SIO2HL | 1.56028890 | 181.779 |

TABLE 1-continued

| Surface | Radii | Thicknesses | Material | Refractive index 193.2 nm | ½ free diameter |
|---|---|---|---|---|---|
| 26 | −1068.929463970 | 1.000000000 | N2VP950 | 1.00000300 | 183.468 |
| 27 | 512.804453822 | 85.879726018 | SIO2HL | 1.56028890 | 192.485 |
| 28 | −489.298237991 AS | 48.000806847 | N2VP950 | 1.00000300 | 192.048 |
| 29 | −255.199113275 AS | 15.204316739 | SIO2HL | 1.56028890 | 190.697 |
| 30 | −408.017115393 | 30.694150369 | N2VP950 | 1.00000300 | 196.643 |
| 31 | 0.000000000 | −14.622598208 | N2VP950 | 1.00000300 | 196.692 |
| 32 | 299.575126721 | 81.075589692 | SIO2HL | 1.56028890 | 199.963 |
| 33 | 1234.064936323 AS | 1.043659212 | N2VP950 | 1.00000300 | 196.087 |
| 34 | 211.382655255 | 76.486237035 | SIO2HL | 1.56028890 | 166.835 |
| 35 | 945.579070441 AS | 1.000000000 | N2VP950 | 1.00000300 | 160.232 |
| 36 | 124.953815758 | 49.441802491 | SIO2HL | 1.56028890 | 109.457 |
| 37 | 254.183893856 AS | 1.000000000 | N2VP950 | 1.00000300 | 97.120 |
| 38 | 99.333101280 | 76.128099196 | SIO2HL | 1.56028890 | 76.544 |
| 39 | 0.000000000 | 1.998587231 | IMMERS | 1.43500000 | 15.560 |
| 40 | 0.000000000 | 0.000000000 |  | 1.00000000 | 11.216 |

TABLE 2

Aspheric constant

Surface No. 1

| K | 00000 |
|---|---|
| C1 | 371267043e−007 |
| C2 | −882594301e−011 |
| C3 | 118826876e−014 |
| C4 | −287728419e−018 |
| C5 | 555321666e−022 |
| C6 | −549582739e−026 |
| C7 | 243863873e−030 |
| C8 | 000000000e+000 |
| C9 | 000000000e+000 |

Surface No. 3

| K | 00000 |
|---|---|
| C1 | −165739114e−007 |
| C2 | 691478272e−011 |
| C3 | −456133228e−015 |
| C4 | 952019198e−019 |
| C5 | −266949578e−022 |
| C6 | 263539717e−026 |
| C7 | −878182245e−031 |
| C8 | 000000000e+000 |
| C9 | 000000000e+000 |

Surface No. 5

| K | 00000 |
|---|---|
| C1 | 151725747e−007 |
| C2 | −569441977e−012 |
| C3 | −806484964e−016 |
| C4 | 160003519e−019 |
| C5 | 582581254e−024 |
| C6 | −281650392e−027 |
| C7 | 189184398e−031 |
| C8 | 000000000e+000 |
| C9 | 000000000e+000 |

Surface No. 7

| K | 00000 |
|---|---|
| C1 | −451804621e−008 |
| C2 | 105687249e−012 |
| C3 | 968348619e−017 |
| C4 | −784284075e−021 |
| C5 | 206431753e−025 |
| C6 | 548912115e−030 |
| C7 | −385059319e−034 |
| C8 | 000000000e+000 |
| C9 | 000000000e+000 |

Surface No. 10

| K | 00000 |
|---|---|
| C1 | −965366426e−009 |
| C2 | 122772701e−014 |

TABLE 2-continued

Aspheric constant

| C3 | 142388685e−016 |
|---|---|
| C4 | −103892528e−020 |
| C5 | 318282087e−025 |
| C6 | 328954553e−031 |
| C7 | −240623653e−034 |
| C8 | 000000000e+000 |
| C9 | 000000000e+000 |

Surface No. 14

| K | 00000 |
|---|---|
| C1 | −215298945e−007 |
| C2 | −726837025e−012 |
| C3 | −219233406e−015 |
| C4 | 190729935e−019 |
| C5 | −143595848e−022 |
| C6 | 293973219e−026 |
| C7 | −394266384e−030 |
| C8 | 000000000e+000 |
| C9 | 000000000e+000 |

Surface No. 18

| K | 00000 |
|---|---|
| C1 | −357912507e−011 |
| C2 | −412582474e−012 |
| C3 | 373943565e−016 |
| C4 | −257921060e−020 |
| C5 | 961326142e−025 |
| C6 | −958283316e−030 |
| C7 | −419939024e−034 |
| C8 | 000000000e+000 |
| C9 | 000000000e+000 |

Surface No. 23

| K | 00000 |
|---|---|
| C1 | −648378589e−009 |
| C2 | −430629472e−015 |
| C3 | −125331200e−018 |
| C4 | −256831146e−023 |
| C5 | −209613588e−027 |
| C6 | 260560345e−032 |
| C7 | −105170270e−036 |
| C8 | 000000000e+000 |
| C9 | 000000000e+000 |

Surface No. 28

| K | 00000 |
|---|---|
| C1 | −478746317e−010 |
| C2 | 539031101e−014 |
| C3 | −368539150e−019 |
| C4 | −518299349e−024 |
| C5 | −194271919e−028 |
| C6 | 354630998e−033 |
| C7 | 103993691e−038 |

TABLE 2-continued

| Aspheric constant | |
|---|---|
| C8 | 000000000e+000 |
| C9 | 000000000e+000 |
| Surface No. 29 | |
| K | 00000 |
| C1 | −711087855e−011 |
| C2 | 670292603e−014 |
| C3 | −338818049e−019 |
| C4 | 148875707e−023 |
| C5 | −561629567e−028 |
| C6 | 160959953e−032 |
| C7 | −803319076e−038 |
| C8 | 000000000e+000 |
| C9 | 000000000e+000 |
| Surface No. 33 | |
| K | 00000 |
| C1 | −475159499e−009 |
| C2 | 488790782e−014 |
| C3 | −166792427e−018 |
| C4 | 452942489e−023 |
| C5 | −744726495e−028 |
| C6 | 699564479e−033 |
| C7 | −286675157e−038 |
| C8 | 000000000e+000 |
| C9 | 000000000e+000 |

TABLE 2-continued

| Aspheric constant | |
|---|---|
| Surface No. 35 | |
| K | 00000 |
| C1 | −368190267e−009 |
| C2 | 293519295e−013 |
| C3 | −299249062e−018 |
| C4 | 271670797e−023 |
| C5 | −789821541e−028 |
| C6 | 220097667e−032 |
| C7 | −595782128e−038 |
| C8 | 000000000e+000 |
| C9 | 000000000e+000 |
| Surface No. 37 | |
| K | 00000 |
| C1 | 516064461e−008 |
| C2 | 995673600e−013 |
| C3 | 282156131e−017 |
| C4 | 276881057e−021 |
| C5 | 168223005e−025 |
| C6 | −138684760e−029 |
| C7 | 142262160e−033 |
| C8 | 000000000e+000 |
| C9 | 000000000e+000 |

TABLE 3

| | LG1 | LG2 | LG3 | LG4 | LG5 | Total |
|---|---|---|---|---|---|---|
| Focal lengths | −1.47E+02 | 1.36E+02 | −5.68E+01 | 1.73E+02 | 1.21E+02 | 2.11E+02 |
| Refractive powers | −6.82E−03 | 7.35E−03 | −1.76E−02 | 5.79E−03 | 8.29E−03 | 4.73E−03 |
| F'/Fg | −1.44E+00 | 1.55E+00 | −3.72E+00 | 1.22E+00 | 1.75E+00 | 1.00E+00 |
| F'*LLW | −1.99E−01 | 2.14E−01 | −5.13E−01 | 1.69E−01 | 2.41E−01 | |
| Axial length | 2.95E+01 | 1.46E+02 | 2.14E+02 | 3.07E+02 | 2.88E+02 | |
| Lenses | 11–12 | 13–15 | 16–19 | 20–25 | 26–29 | |

TABLE 4

| Surfaces | f | F' | |F'| | |F'|*LLW | F'/Fg | CHV | CHV/CHVmax |
|---|---|---|---|---|---|---|---|
| F1 . . . 2) | −2.60E+02 | −3.84E−03 | 3.84E−03 | 1.12E−01 | −8.11E−01 | −5.00E−06 | −2.38E−01 |
| F3 . . . 4) | −3.61E+02 | −2.77E−03 | 2.77E−03 | 8.06E−02 | −5.85E−01 | −5.00E−06 | −2.38E−01 |
| F5 . . . 6) | 4.67E+02 | 2.14E−03 | 2.14E−03 | 6.24E−02 | 4.52E−01 | 1.30E−05 | 6.19E−01 |
| F7 . . . 8) | 3.36E+02 | 2.97E−03 | 2.97E−03 | 8.66E−02 | 6.28E−01 | 2.10E−05 | 1.00E+00 |
| F9 . . . 10) | 4.87E+02 | 2.05E−03 | 2.05E−03 | 5.98E−02 | 4.34E−01 | 1.60E−05 | 7.62E−01 |
| F11 . . . 12) | −7.58E+02 | −1.32E−03 | 1.32E−03 | 3.84E−02 | −2.78E−01 | 3.00E−06 | 1.43E−01 |
| F13 . . . 14) | −2.14E+02 | −4.67E−03 | 4.67E−03 | 1.36E−01 | −9.87E−01 | −1.10E−05 | −5.24E−01 |
| F15 . . . 16) | −3.98E+02 | −2.51E−03 | 2.51E−03 | 7.32E−02 | −5.31E−01 | −6.00E−06 | −2.86E−01 |
| F17 . . . 18) | −1.45E+02 | −6.87E−03 | 6.87E−03 | 2.00E−01 | −1.45E+00 | −1.60E−05 | −7.62E−01 |
| F19 . . . 20) | 8.71E+02 | 1.15E−03 | 1.15E−03 | 3.35E−02 | 2.43E−01 | 5.00E−06 | 2.38E−01 |
| F21 . . . 22) | 8.56E+02 | 1.17E−03 | 1.17E−03 | 3.40E−02 | 2.47E−01 | 7.00E−06 | 3.33E−01 |
| F23 . . . 24) | 6.54E+02 | 1.53E−03 | 1.53E−03 | 4.45E−02 | 3.23E−01 | 8.00E−06 | 3.81E−01 |
| F25 . . . 26) | 1.66E+03 | 6.01E−04 | 6.01E−04 | 1.75E−02 | 1.27E−01 | 3.00E−06 | 1.43E−01 |
| F27 . . . 28) | 4.61E+02 | 2.17E−03 | 2.17E−03 | 6.32E−02 | 4.58E−01 | 9.00E−06 | 4.29E−01 |
| F29 . . . 30) | −1.26E+03 | −7.93E−04 | 7.93E−04 | 2.31E−02 | −1.67E−01 | −1.00E−06 | −4.76E−02 |
| F32 . . . 33) | 6.85E+02 | 1.48E−03 | 1.46E−03 | 4.25E−02 | 3.08E−01 | −1.00E−06 | −4.76E−02 |
| F34 . . . 35) | 4.68E+02 | 2.14E−03 | 2.14E−03 | 6.22E−02 | 4.51E−01 | −4.00E−06 | −1.90E−01 |
| F36 . . . 37) | 3.86E+02 | 2.59E−03 | 2.59E−03 | 7.55E−02 | 5.48E−01 | −6.00E−06 | −2.86E−01 |
| F38 . . . 39) | 2.54E+02 | 3.93E−03 | 3.93E−03 | 1.14E−01 | 8.30E−01 | −9.00E−06 | −4.29E−01 |

TABLE 5

| Surface | sin (i) | (i) [°] | sin (i)/NA |
|---|---|---|---|
| 0 | 0.26 | 15.07 | 0.29 |
| 1 | 0.343 | 20.06 | 0.38 |
| 2 | 0.761 | 49.55 | 0.84 |
| 3 | 0.675 | 42.46 | 0.75 |
| 4 | 0.869 | 60.34 | 0.96 |
| 5 | 0.686 | 43.32 | 0.76 |
| 6 | 0.409 | 24.14 | 0.45 |
| 7 | 0.367 | 21.53 | 0.41 |
| 8 | 0.453 | 26.94 | 0.50 |
| 9 | 0.662 | 41.45 | 0.73 |
| 10 | 0.264 | 15.31 | 0.29 |
| 11 | 0.687 | 43.39 | 0.76 |
| 12 | 0.834 | 56.51 | 0.92 |
| 13 | 0.406 | 23.95 | 0.45 |
| 14 | 0.595 | 36.51 | 0.66 |
| 15 | 0.618 | 38.17 | 0.68 |
| 16 | 0.345 | 20.18 | 0.38 |
| 17 | 0.785 | 51.72 | 0.87 |
| 18 | 0.776 | 50.90 | 0.86 |
| 19 | 0.573 | 34.96 | 0.63 |

TABLE 5-continued

| Surface | sin (i) | (i) [°] | sin (i)/NA |
|---|---|---|---|
| 20 | 0.16 | 9.21 | 0.18 |
| 21 | 0.41 | 24.21 | 0.45 |
| 22 | 0.306 | 17.62 | 0.34 |
| 23 | 0.281 | 16.32 | 0.31 |
| 24 | 0.483 | 28.88 | 0.53 |
| 25 | 0.406 | 23.95 | 0.45 |
| 26 | 0.126 | 7.24 | 0.14 |
| 27 | 0.608 | 37.45 | 0.67 |
| 28 | 0.65 | 40.54 | 0.72 |
| 29 | 0.895 | 63.51 | 0.99 |
| 30 | 0.51 | 30.66 | 0.56 |
| 32 | 0.706 | 44.91 | 0.78 |
| 33 | 0.367 | 21.53 | 0.41 |
| 34 | 0.503 | 30.20 | 0.56 |
| 35 | 0.584 | 35.73 | 0.64 |
| 36 | 0.276 | 16.02 | 0.30 |
| 37 | 0.586 | 35.87 | 0.65 |
| 38 | 0.364 | 21.35 | 0.40 |
| 39 | 0.836 | 56.72 | 0.92 |
| 40 | 0.906 | 64.96 | 1.00 |

TABLE 6

| Surface | Radii | Thicknesses | Material | Refraktiv index 193.368 nm | ½ free diameter |
|---|---|---|---|---|---|
| 0 | 0.000000000 | 29.959527308 |  | 1.00000000 | 56.000 |
| 1 | 0.000000000 | −0.016913454 |  | 1.00000000 | 61.135 |
| 2 | −1424.443154673AS | 9.987985063 | SIO2V | 1.56078570 | 61.131 |
| 3 | 531.050343653 | 9.225587631 | HE | 1.00003289 | 62.641 |
| 4 | −1315.866097532 | 9.986132305 | SIO2V | 1.56078570 | 63.624 |
| 5 | 143.128482593AS | 40.559989076 | HE | 1.00003289 | 67.531 |
| 6 | 641.321043150AS | 49.240502472 | SIO2V | 1.56078570 | 81.211 |
| 7 | −218.977712869 | 0.998798945 | HE | 1.00003289 | 87.963 |
| 8 | −1092.677562181 | 19.902882081 | SIO2V | 1.56078570 | 90.014 |
| 9 | −311.840626623 | 0.998466971 | HE | 1.00003289 | 91.145 |
| 10 | 231.495479260 | 9.997963953 | SIO2V | 1.56078570 | 91.384 |
| 11 | 136.424871433AS | 14.583455774 | HE | 1.00003289 | 88.174 |
| 12 | 207.612238848 | 41.794232842 | SIO2V | 1.56078570 | 89.096 |
| 13 | −342.405731396 | 0.999019752 | HE | 1.00003289 | 88.753 |
| 14 | 88.460595521 | 57.657980357 | SIO2V | 1.56078570 | 76.562 |
| 15 | 95.574785628 | 11.929831887 | HE | 1.00003289 | 56.768 |
| 16 | 143.800783044 | 9.998912890 | SIO2V | 1.56078570 | 54.565 |
| 17 | 54.871822384 | 37.580075846 | HE | 1.00003289 | 43.961 |
| 18 | −91.160542057 | 26.385017659 | SIO2V | 1.56078570 | 43.259 |
| 19 | 145.971856718AS | 33.207912138 | HE | 1.00003289 | 47.597 |
| 20 | −63.479146081 | 10.065790428 | SIO2V | 1.56078570 | 48.739 |
| 21 | 566.741654029 | 18.182386924 | HE | 1.00003289 | 69.201 |
| 22 | −295.688670061 | 40.326191169 | SIO2V | 1.56078570 | 75.940 |
| 23 | −137.879376820 | 1.058510991 | HE | 1.00003289 | 90.451 |
| 24 | −234.461401510 | 32.298714405 | SIO2V | 1.56078570 | 101.105 |
| 25 | −155.870582526 | 2.467573485 | HE | 1.00003289 | 108.928 |
| 26 | −457.573287328AS | 34.513989921 | SIO2V | 1.56078570 | 128.678 |
| 27 | −256.328309848 | 0.999233259 | HE | 1.00003289 | 133.138 |
| 28 | −7362.805157612 | 33.881595936 | SIO2V | 1.56078570 | 143.939 |
| 29 | −433.193106668 | 0.999119988 | HE | 1.00003289 | 145.845 |
| 30 | 733.950029037 | 33.171028525 | SIO2V | 1.56078570 | 150.039 |
| 31 | −797.700668581AS | 0.999523145 | HE | 1.00003289 | 149.920 |
| 32 | 628.671569204 | 54.808414933 | SIO2V | 1.56078570 | 149.124 |
| 33 | −421.327827135 | 40.550671041 | HE | 1.00003289 | 148.061 |

TABLE 6-continued

| Surface | Radii | Thicknesses | Material | Refraktiv index 193.368 nm | ½ free diameter |
|---|---|---|---|---|---|
| 34 | −183.041534671AS | 14.245361502 | SIO2V | 1.56078570 | 146.048 |
| 35 | −590.419446395 | 0.999852843 | HE | 1.00003289 | 153.746 |
| 36 | 420.004155385 | 46.911699389 | SIO2V | 1.56078570 | 156.958 |
| 37 | −1311.368773664AS | 30.643333522 | HE | 1.00003289 | 155.907 |
| 38 | 0.000000000 | −29.650615857 | HE | 1.00003289 | 149.419 |
| 39 | 302.808388697 | 60.633906849 | SIO2V | 1.56078570 | 148.251 |
| 40 | −1328.310374037AS | 0.997714230 | HE | 1.00003289 | 145.494 |
| 41 | 124.075249887 | 53.974430752 | SIO2V | 1.56078570 | 102.260 |
| 42 | 598.110457937AS | 0.995860546 | HE | 1.00003289 | 92.898 |
| 43 | 59.889952115 | 60.109366540 | SIO2V | 1.56078570 | 54.202 |
| 44 | 0.000000000 | 1.000052369 | H2OV193B | 1.43662694 | 9.767 |
| 45 | 0.000000000 | 0.000000000 | | 1.00000000 | 7.000 |

TABLE 7

Aspheric constants

Surface No. 2

| K | 0.0000 |
|---|---|
| C1 | 2.26821920e−007 |
| C2 | −4.48881873e−011 |
| C3 | 2.12450788e−015 |
| C4 | 8.08450652e−019 |
| C5 | −3.44540449e−022 |
| C6 | 4.10209860e−026 |
| C7 | 0.00000000e+000 |
| C8 | 0.00000000e+000 |
| C9 | 0.00000000e+000 |

Surface No. 5

| K | 0.0000 |
|---|---|
| C1 | −3.11728384e−007 |
| C2 | 2.80630147e−012 |
| C3 | 1.91939883e−015 |
| C4 | −8.18512919e−019 |
| C5 | 1.50584700e−022 |
| C6 | −8.32448975e−027 |
| C7 | 0.00000000e+000 |
| C8 | 0.00000000e+000 |
| C9 | 0.00000000e+000 |

Surface No. 6

| K | 0.0000 |
|---|---|
| C1 | −1.40214999e−007 |
| C2 | 1.58684255e−011 |
| C3 | −8.63321874e−016 |
| C4 | −3.40279126e−020 |
| C5 | 1.56369475e−023 |
| C6 | −9.12764213e−028 |
| C7 | 0.00000000e+000 |
| C8 | 0.00000000e+000 |
| C9 | 0.00000000e+000 |

Surface No. 11

| K | 0.0000 |
|---|---|
| C1 | −4.72454704e−008 |
| C2 | 3.46416480e−012 |
| C3 | −1.09160042e−016 |
| C4 | −9.56055803e−021 |
| C5 | 1.67190428e−024 |
| C6 | −7.08525660e−029 |
| C7 | 0.00000000e+000 |
| C8 | 0.00000000e+000 |
| C9 | 0.00000000e+000 |

Surface No. 19

| K | 0.0000 |
|---|---|
| C1 | −2.76571892e−007 |
| C2 | −1.85643840e−011 |
| C3 | −1.36453442e−015 |
| C4 | 3.50300729e−019 |

TABLE 7-continued

Aspheric constants

| C5 | −1.87275583e−022 |
|---|---|
| C6 | 5.25847463e−026 |
| C7 | 0.00000000e+000 |
| C8 | 0.00000000e+000 |
| C9 | 0.00000000e+000 |

Surface No. 26

| K | 0.0000 |
|---|---|
| C1 | 4.80486857e−009 |
| C2 | 8.75328485e−013 |
| C3 | −1.21918811e−017 |
| C4 | 1.75313663e−022 |
| C5 | −1.92362253e−026 |
| C6 | 9.56346186e−031 |
| C7 | 0.00000000e+000 |
| C8 | 0.00000000e+000 |
| C9 | 0.00000000e+000 |

Surface No. 31

| K | 0.0000 |
|---|---|
| C1 | 1.19764229e−008 |
| C2 | 1.91699881e−013 |
| C3 | −7.05272499e−018 |
| C4 | 1.33971804e−022 |
| C5 | −4.92635133e−027 |
| C6 | 6.37372485e−032 |
| C7 | 0.00000000e+000 |
| C8 | 0.00000000e+000 |
| C9 | 0.00000000e+000 |

Surface No. 34

| K | 0.0000 |
|---|---|
| C1 | 1.71472327e−008 |
| C2 | 4.46253272e−014 |
| C3 | 5.49240286e−018 |
| C4 | −2.26404865e−022 |
| C5 | 1.06225351e−026 |
| C6 | 2.30721400e−031 |
| C7 | 0.00000000e+000 |
| C8 | 0.00000000e+000 |
| C9 | 0.00000000e+000 |

Surface No. 37

| K | 0.0000 |
|---|---|
| C1 | −2.25392291e−009 |
| C2 | 8.74411421e−013 |
| C3 | −4.61128670e−017 |
| C4 | 9.65794382e−022 |
| C5 | 4.85877680e−027 |
| C6 | −2.79511512e−031 |
| C7 | 0.00000000e+000 |
| C8 | 0.00000000e+000 |
| C9 | 0.00000000e+000 |

TABLE 7-continued

Aspheric constants

Surface No. 40

| | |
|---|---|
| K | 0.0000 |
| C1 | −1.45855175e−008 |
| C2 | 5.45064648e−014 |
| C3 | 5.13932305e−017 |
| C4 | −3.50786399e−021 |
| C5 | 9.44625063e−026 |
| C6 | −9.23548061e−031 |
| C7 | 0.00000000e+000 |
| C8 | 0.00000000e+000 |
| C9 | 0.00000000e+000 |

Surface No. 42

| | |
|---|---|
| K | 0.0000 |
| C1 | 4.95488619e−008 |
| C2 | −1.77810485e−012 |
| C3 | 1.38634050e−016 |
| C4 | −2.17059559e−021 |
| C5 | 1.34695165e−025 |
| C6 | −9.49441000e−030 |
| C7 | 0.00000000e+000 |
| C8 | 0.00000000e+000 |
| C9 | 0.00000000e+000 |

The invention claimed is:

1. A refractive projection objective for projecting a pattern arranged in an object plane of the projection objective into an image plane of the projection objective comprising:
   a first lens group with negative refractive power following the object plane;
   a second lens group with positive refractive power following the first lens group;
   a third lens group with negative refractive power following the second lens group;
   a fourth lens group with positive refractive power following the third lens group;
   a fifth lens group with positive refractive power following the fourth lens group; and
   a system aperture that is arranged in a transition region from the fourth lens group to the fifth lens group,
   so as to form a single-waist system with an object-side belly, an image-side belly and a waist, arranged between the object-side belly and the image-side belly, with a constriction site of narrowest constriction of a beam;
   wherein:
      the projection objective is designed as an immersion objective for projecting a pattern arranged in an object plane of the projection objective into an image plane of the projection objective with the aid of an immersion medium arranged between a last optical element of the projection objective and the image plane;
      a waist distance AT exists between the object plane and the constriction site, and the condition AT/L≦0.4 holds for a distance ratio AT/L between the waist distance AT and an object-image distance L of the projection objective; and
      the object-side belly has a first diameter D1, the image-side belly has a second diameter D3, and a belly diameter ratio D3/D1>1.5.

2. The projection objective as claimed in claim 1, wherein the waist has a waist diameter D2 at the constriction site, and wherein D3/D2>3 for a diameter ratio D3/D2 between the diameter of the image-side belly and the waist diameter.

3. The projection objective as claimed in claim 1, wherein, in the third lens group, a front negative refractive power of magnitude VBK is arranged upstream of the constriction site and a rear negative refractive power of magnitude HBK is arranged downstream of the constriction site, and HBK/VBK≧3 for a refractive power ratio of the magnitudes.

4. The projection objective as claimed in claim 1, wherein the third lens group comprises a rear negative lens and at least one front negative lens arranged upstream of the rear negative lens, the magnitude of the negative refractive power of the rear negative lens being at least 20% greater than the magnitude of the negative refractive power of the at least one front negative lens.

5. The projection objective as claimed in claim 1, wherein the third lens group comprises a rear negative lens and at least one front negative lens arranged upstream of the rear negative lens, the magnitude of the negative refractive power of the rear negative lens being at least 20% greater than the magnitude of the total refractive power of the projection objective.

6. The projection objective as claimed in claim 1, wherein the first lens group includes at least one aspheric surface.

7. The projection objective as claimed in claim 6, wherein the first lens group includes at least two aspheric surfaces.

8. The projection objective as claimed in claim 1, wherein the first lens group includes at least two lenses having respectively one aspheric surface.

9. The projection objective as claimed in claim 1, wherein at least one aspheric surface is arranged in the second lens group.

10. The projection objective as claimed in claim 9, wherein the aspheric surface is arranged in a region of the surface with the largest principal beam height of the second lens group.

11. The projection objective as claimed in claim 1, wherein at least one concave surface is respectively fashioned as aspheric surface in at least one of the third lens group and the fourth lens group.

12. The projection objective as claimed in claim 1, wherein at least one aspheric surface is provided in the third lens group.

13. The projection objective as claimed in claim 12, wherein two aspheric surfaces are provided in the third lens group.

14. The projection objective as claimed in claim 1, wherein at least one aspheric surface is arranged in each lens group.

15. The projection objective as claimed in claim 1, wherein the second lens group has at least two successive lenses with positive refractive power.

16. The projection objective as claimed in claim 15, wherein the second lens group has at least three successive lenses with positive refractive power.

17. The projection objective as claimed in claim 1, wherein the second lens group has at least one meniscus lens that is concave relative to the image plane and is of positive refractive power.

18. The projection objective as claimed in claim 1, wherein the third lens group only has lenses of negative refractive power.

19. The projection objective as claimed in claim 1, wherein in an object-side entrance region the fourth lens group has at least one meniscus lens that is concave relative to the object plane and is of positive refractive power.

20. The projection objective as claimed in claim 19, wherein a number of at least two meniscus lenses that are concave relative to the object plane and have positive refractive power are arranged successively in the object-side entrance region of the fourth lens group.

21. The projection objective as claimed in claim 1, wherein at least one meniscus lens that is concave relative to the object plane is arranged in the fourth lens group.

22. The projection objective as claimed in claim 21, wherein the meniscus lens is designed as a negative meniscus lens.

23. The projection objective as claimed in claim 21, wherein the meniscus lens is arranged directly upstream of the system aperture in the region of large marginal beam heights.

24. The projection objective as claimed in claim 21, wherein the largest incidence angles of the incident radiation in the entire projection objective occur at the concave surface of the meniscus lens.

25. The projection objective as claimed in claim 21, wherein at least one lens of positive refractive power is arranged directly upstream of the meniscus lens.

26. The projection objective as claimed in claim 25, wherein the lens of positive refractive power is a biconvex lens.

27. The projection objective as claimed in claim 1, wherein at least one lens doublet having at least one positive lens and a directly following negative lens that is concave relative to the object plane is arranged in the fourth lens group.

28. The projection objective as claimed in claim 1, wherein the fifth lens group has at least one meniscus lens of positive refractive power and with lens surfaces that are concave relative to the image.

29. The projection objective as claimed in claim 28, wherein a number of at least two meniscus lenses of positive refractive power and with lens surfaces that are concave relative to the image are provided in the fifth lens group.

30. The projection objective as claimed in claim 1, wherein the fifth lens group has as last optical element a plano-convex lens that has a curved entrance surface and a substantially flat exit surface.

31. The projection objective as claimed in claim 30, wherein the plano-convex lens is of non-hemispherical design.

32. The projection objective as claimed in claim 1, wherein the image plane directly follows the fifth lens group such that the projection objective has no further lens or lens group apart from the first to fifth lens group.

33. The projection objective as claimed in claim 1, wherein all lenses consist of the same material.

34. The projection objective as claimed in claim 33, wherein the projection objective is designed for an operating wavelength of 193 nm and wherein all lenses consist of fused silica.

35. The projection objective as claimed in claim 33, wherein the projection objective is designed for an operating wavelength of 157 nm and all lenses consist of calcium fluoride.

36. The projection objective as claimed in claim 1, which has a 4:1 or 5:1 reduction ratio or a reduction ratio which is an even-numbered multiple of 4:1 or 5:1.

37. The projection objective as claimed in claim 1, the projection objective being adapted to an immersion medium that has a refractive index of n>1.3 at an operating wavelength.

38. A refractive projection objective for projecting a pattern arranged in an object plane of the projection objective into an image plane of the projection objective comprising:
a first lens group with negative refractive power following the object plane;
a second lens group with positive refractive power following the first lens group;
a third lens group with negative refractive power following the second lens group;
a fourth lens group with positive refractive power following the third lens group;
a fifth lens group with positive refractive power following the fourth lens group; and
a system aperture that is arranged in a transition region from the fourth lens group to the fifth lens group,
so as to form a single-waist system with an object-side belly, an image-side belly and a waist, arranged between the object-side belly and the image-side belly, with a constriction site of narrowest constriction of a beam,
wherein:
a waist distance AT exists between the object plane and the constriction site, and the condition $AT/L \leq 0.4$ holds for a distance ratio AT/L between the waist distance AT and an object-image distance L of the projection objective;
the object-side belly has a first diameter D1, the image-side belly has a second diameter D3, and belly diameter ratio D3/D1>1.5; and
the projection objective has an image-side numerical aperture of $NA \geq 1.0$.

39. The projection objective as claimed in claim 38, which has an image-side numerical aperture one of at least NA=1.1 and at least NA=1.2 and at least NA=1.3.

40. The projection objective as claimed in claim 38, wherein the waist has a waist diameter D2 at the constriction site, and wherein $D3/D2 \geq 3$ for a diameter ratio D3/D2 between the diameter of the image-side belly and the waist diameter.

41. A projection exposure machine for microlithography comprising:
a refractive projection objective for projecting a pattern arranged in an object plane of the projection objective into an image plane of the projection objective including:
a first lens group with negative refractive power following the object plane;
a second lens group with positive refractive power following the first lens group;
a third lens group with negative refractive power following the second lens group;
a fourth lens group with positive refractive power following the third lens group;
a fifth lens group with positive refractive power following the fourth lens group; and
a system aperture that is arranged in a transition region from the fourth lens group to the fifth lens group,
so as to form a single-waist system with an object-side belly, an image-side belly and a waist, arranged between the object-side belly and the image-side belly, with a constriction site of narrowest constriction of a beam;
wherein:
the projection objective is designed as an immersion objective for projecting a pattern arranged in an object plane of the projection objective into an image plane of the projection objective with the aid of an immersion medium arranged between a last optical element of the projection objective and the image plane;

a waist distance AT exists between the object plane and the constriction site, and the condition AT/L≦0.4 holds for a distance ratio AT/L between the waist distance AT and an object-image distance L of the projection objective; and the object-side belly has a first diameter D1, the image-side belly has a second diameter D3, and a belly diameter ratio D3/D1>1.5.

42. A method for producing at least one of semiconductor components and other finely structured components comprising:

providing a mask with a prescribed pattern; and illuminating the mask with ultraviolet light of a prescribed wavelength;

projecting an image of the pattern onto a photosensitive substrate, arranged in the region of the image plane of a projection objective, with the aid of a projection objective including:

a first lens group with negative refractive power following the object plane;

a second lens group with positive refractive power following the first lens group;

a third lens group with negative refractive power following the second lens group;

a fourth lens group with positive refractive power following the third lens group;

a fifth lens group with positive refractive power following the fourth lens group; and a system aperture that is arranged in a transition region from the fourth lens group to the fifth lens group, so as to form a single-waist system with an object-side belly, an image-side belly and a waist, arranged between the object-side belly and the image-side belly, with a constriction site of narrowest constriction of a beam, a waist distance AT existing between the object plane and the constriction site, and the condition AT/L≦0.4 holding for a distance ratio AT/L between the waist distance AT and an object-image distance L of the projection objective;

an immersion medium arranged between a last optical surface of the projection objective and the substrate being trans-irradiated during projection.

43. A method for producing at least one of semiconductor components and other finely structured components comprising:

providing a projection objective for projecting a pattern arranged in an object plane of the projection objective into an image plane of the projection objective including:

a first lens group with negative refractive power following the object plane;

a second lens group with positive refractive power following the first lens group;

a third lens group with negative refractive power following the second lens group;

a fourth lens group with positive refractive power following the third lens group;

a fifth lens group with positive refractive power following the fourth lens group; and a system aperture that is arranged in a transition region from the fourth lens group to the fifth lens group, so as to form a single-waist system with an object-side belly, an image-side belly and a waist, arranged between the object-side belly and the image-side belly, with a constriction site of narrowest constriction of a beam, a waist distance AT existing between the object plane and the constriction site, and the condition AT/L≦0.4 holding for a distance ratio AT/L between the waist distance AT and an object-image distance L of the projection objective;

providing a photosensitive substrate in the region of the image plane of the projection objective;

illuminating the mask with ultraviolet light of a prescribed operating wavelength;

setting a finite working distance between an exit surface assigned to the projection objective and an incoupling surface assigned to the substrate, the working distance being set inside an exposure time interval at least temporarily to a value that is smaller than a maximum extent of an optical near field of the light emerging from the exit surface; and projecting an image of the pattern onto the photosensitive substrate with the aid of the projection objective.

44. The method as claimed in claim 43, wherein at least temporarily a working distance is set that is less than four times the operating wavelength.

45. The method as claimed in claim 44, wherein at least temporarily a working distance is set that is less than 50% of the operating wavelength.

46. A refractive projection objective for projecting a pattern arranged in an object plane of the projection objective into an image plane of the projection objective comprising:

a first lens group with negative refractive power following the object plane;

a second lens group with positive refractive power following the first lens group;

a third lens group with negative refractive power following the second lens group;

a fourth lens group with positive refractive power following the third lens group;

a fifth lens group with positive refractive power following the fourth lens group; and a system aperture that is arranged in a transition region from the fourth lens group to the fifth lens group, so as to form a single-waist system with an object-side belly, an image-side belly and a waist, arranged between the object-side belly and the image-side belly, with a constriction site of narrowest constriction of a beam;

wherein the projection objective is designed as an immersion objective for projecting a pattern arranged in an object plane of the projection objective into an image plane of the projection objective with the aid of an immersion medium arranged between a last optical element of the projection objective and the image plane; and the object-side belly has a first diameter D1, the image-side belly has a second diameter D3, and a belly diameter ratio D3/D1>1.5.

47. A refractive projection objective for projecting a pattern arranged in an object plane of the projection objective into an image plane of the projection objective comprising:

a first lens group with negative refractive power following the object plane;

a second lens group with positive refractive power following the first lens group;

a third lens group with negative refractive power following the second lens group;

a fourth lens group with positive refractive power following the third lens group;

a fifth lens group with positive refractive power following the fourth lens group; and a system aperture that is arranged in a transition region from the fourth lens group to the fifth lens group, so as to form a single-waist system with an object-side belly, an image-side belly and a waist, arranged between the object-side belly and the image-side belly, with a constriction site of narrowest constriction of a beam, wherein:
the object-side belly has a first diameter D1, the image-side belly has a second diameter D3, and a belly diameter ratio D3/D1>1.5; and the projection objective has an image-side numerical aperture of NA≧1.0.

48. A projection exposure machine for microlithography comprising:

a refractive projection objective for projecting a pattern arranged in an object plane of the projection objective into an image plane of the projection objective including:

a first lens group with negative refractive power following the object plane;

a second lens group with positive refractive power following the first lens group;

a third lens group with negative refractive power following the second lens group;

a fourth lens group with positive refractive power following the third lens group;

a fifth lens group with positive refractive power following the fourth lens group; and a system aperture that is arranged in a transition region from the fourth lens group to the fifth lens group, so as to form a single-waist system with an object-side belly, an image-side belly and a waist, arranged between the object-side belly and the image-side belly, with a constriction site of narrowest constriction of a beam;

wherein:
the projection objective is designed as an immersion objective for projecting a pattern arranged in an object plane of the projection objective into an image plane of the projection objective with the aid of an immersion medium arranged between a last optical element of the projection objective and the image plane; and the object-side belly has a first diameter D1, the image-side belly has a second diameter D3, and a belly diameter ratio D3/D1>1.5.

* * * * *